United States Patent
Kokubo et al.

(10) Patent No.: US 9,685,254 B2
(45) Date of Patent: Jun. 20, 2017

(54) DIELECTRIC FILM, METHOD FOR MANUFACTURING THE SAME, AND TRANSDUCER INCLUDING THE SAME

(71) Applicants: Sumitomo Riko Company Limited, Aichi-ken (JP); KYUSHU UNIVERSITY, NATIONAL UNIVERSITY CORPORATION, Fukuoka-ken (JP)

(72) Inventors: Yota Kokubo, Aichi-ken (JP); Shigeaki Takamatsu, Aichi-ken (JP); Ryosuke Matsuno, Saga-ken (JP); Atsushi Takahara, Fukuoka-ken (JP); Yuji Higaki, Fukuoka-ken (JP)

(73) Assignees: SUMITOMO RIKO COMPANY LIMITED, Aichi-Ken (JP); KYUSHU UNIVERSITY, NATIONAL UNIVERSITY CORPORATION, Fukuoka-Ken (JP)

(*) Notice: Subject to any disclaimer, the term of this patent is extended or adjusted under 35 U.S.C. 154(b) by 0 days.

(21) Appl. No.: 15/003,962

(22) Filed: Jan. 22, 2016

(65) Prior Publication Data
US 2016/0155532 A1 Jun. 2, 2016

Related U.S. Application Data

(63) Continuation of application No. PCT/JP2015/054987, filed on Feb. 23, 2015.

(30) Foreign Application Priority Data

Mar. 26, 2014 (JP) .................................. 2014-064494

(51) Int. Cl.
H01B 3/28 (2006.01)
C08K 3/22 (2006.01)
(Continued)

(52) U.S. Cl.
CPC ............. *H01B 3/28* (2013.01); *B06B 1/0644* (2013.01); *C08K 3/22* (2013.01); *C08K 3/36* (2013.01);
(Continued)

(58) Field of Classification Search
CPC ....................................................... H01B 3/28
See application file for complete search history.

(56) References Cited

U.S. PATENT DOCUMENTS 3,635,887 A 1/1972 Polmanteer et al.
3,741,721 A 6/1973 Gagliardi et al.
(Continued)

FOREIGN PATENT DOCUMENTS

JP 2007-514033 A 5/2007
JP 2007-153961 A 6/2007
(Continued)

OTHER PUBLICATIONS

International Search Report issued with respect to application No. PCT/JP2015/054987, mail date is May 19, 2015.
(Continued)

*Primary Examiner* — Robert Vetere
(74) *Attorney, Agent, or Firm* — Greenblum & Bernstein, P.L.C.

(57) ABSTRACT

A dielectric film includes an elastomer and nanoparticles dispersed in the elastomer while chemically bound to the elastomer. The nanoparticles have cyano groups and are manufactured by a sol-gel process using an organometallic compound. A method for manufacturing a dielectric film includes: producing a chelate compound of an organometallic compound; producing a sol of metallic oxide particles having cyano groups by adding a silane coupling agent having a cyano group, an organic solvent, and water to the chelate compound; preparing a mixed solution by mixing the
(Continued)

sol of the metallic oxide particles having cyano groups and a polymer solution containing a rubber polymer having a functional group capable of reacting with a hydroxy group; and forming a dielectric film by applying the mixed solution to a substrate and by curing a coating film.

2 Claims, 4 Drawing Sheets

(51) Int. Cl.
  *C08K 3/36*   (2006.01)
  *C08K 9/06*   (2006.01)
  *C08L 9/02*   (2006.01)
  *C08L 13/00*   (2006.01)
  *H01L 41/37*   (2013.01)
  *H04R 19/00*   (2006.01)
  *H04R 31/00*   (2006.01)
  *H01L 41/18*   (2006.01)
  *B06B 1/06*   (2006.01)
  *C09D 115/00*   (2006.01)
  *H01L 41/047*   (2006.01)
  *H01B 3/00*   (2006.01)
  *H04R 19/02*   (2006.01)
  *H04R 19/04*   (2006.01)
  *C08K 5/56*   (2006.01)
(52) U.S. Cl.
  CPC   *C08K 9/06* (2013.01); *C08L 9/02* (2013.01); *C08L 13/00* (2013.01); *C09D 115/005* (2013.01); *H01B 3/002* (2013.01); *H01L 41/047* (2013.01); *H01L 41/183* (2013.01); *H01L 41/37* (2013.01); *H04R 19/00* (2013.01); *H04R 31/00* (2013.01); *C08K 5/56* (2013.01); *H04R 19/02* (2013.01); *H04R 19/04* (2013.01)

(56) References Cited

U.S. PATENT DOCUMENTS

| | | | |
|---|---|---|---|
| 9,076,574 B2* | 7/2015 | Takamatsu | C08L 101/10 |
| 2002/0153824 A1* | 10/2002 | Chigusa | H01J 29/896 |
| | | | 313/477 R |
| 2008/0287578 A1 | 11/2008 | Fuso et al. | |
| 2009/0071368 A1 | 3/2009 | Steingrover et al. | |
| 2011/0300393 A1* | 12/2011 | Iio | C08K 3/36 |
| | | | 428/521 |
| 2013/0037786 A1 | 2/2013 | Miyao et al. | |
| 2013/0293062 A1 | 11/2013 | Takamatsu et al. | |

FOREIGN PATENT DOCUMENTS

| | | |
|---|---|---|
| JP | 2008-199784 A | 8/2008 |
| JP | 2009-173691 A | 8/2009 |
| JP | 2011-072112 A | 4/2011 |
| WO | 2005/059022 A1 | 6/2005 |
| WO | 2011/033956 A1 | 3/2011 |
| WO | 2011/145411 A1 | 11/2011 |
| WO | 2013/047311 A1 | 4/2013 |

OTHER PUBLICATIONS

International Preliminary Report on Patentability issued in Application No. PCT/JP2015/054987, mailed Sep. 27, 2016, along with an English translation thereof.

* cited by examiner though the dielectric particles are dispersed in the elastomer. However, the dielectric particles have high crystallinity and are likely to agglomerate. For this reason, it is difficult to uniformly disperse the dielectric particles in the elastomer. When the dielectric particles agglomerate, agglomerated lumps serve

DIELECTRIC FILM, METHOD FOR MANUFACTURING THE SAME, AND TRANSDUCER INCLUDING THE SAME

CLAIM FOR PRIORITY

This application is a Continuation of PCT/JP2015/054987 filed Feb. 23, 2015, and claims the priority benefit of Japanese application 2014-064494 filed Mar. 26, 2014, the contents of which is expressly incorporated by reference herein in its entirety.

BACKGROUND OF THE INVENTION

1. Field of the Invention

The present invention relates to a transducer including an elastomer material, and in particular, to a dielectric film for use in the transducer and a method for manufacturing the same.

2. Description of Related Art

Transducers are known that perform conversion between mechanical energy and electric energy such as actuators, sensors, and power generating elements, and that perform conversion between acoustic energy and electric energy such as speakers and microphones. In order to produce a highly flexible, compact, and lightweight transducer, polymer materials such as dielectric elastomers are useful. For example, a transducer can be produced by arranging a pair of electrodes on both sides in the thickness direction of a dielectric film formed of a dielectric elastomer.

In order to increase a force and displacement output from the transducer, it is required to increase an electrostatic attraction with respect to an applied voltage or to increase the dielectric breakdown strength of the dielectric film so as to enable a high voltage to be applied. Given these circumstances, there have been various attempts to increase the dielectric constant or the volume resistivity of the dielectric film (refer to Patent Documents 1 to 5, for example).

[Patent Document 1] International Publication No. WO 2013/047311

[Patent Document 2] Japanese Patent Application Publication No. 2009-173691 (JP 2009-173691 A)

[Patent Document 3] Japanese Patent Application Publication No. 2007-153961 (JP 2007-153961 A)

[Patent Document 4] Japanese Patent Application Publication No. 2011-72112 (JP 2011-72112 A)

[Patent Document 5] Japanese Patent Application Publication No. 2008-199784 (JP 2008-199784 A)

SUMMARY OF THE INVENTION

Patent Document 1 describes a dielectric film in which metallic oxide nanoparticles are dispersed in an elastomer. In the dielectric film, the flow of electrons is interrupted by the metallic oxide nanoparticles, and the dielectric breakdown strength of the dielectric film increases. However, the dielectric constant of the dielectric film is not high. In order to enable drive with low voltage and further improve the performance of the transducer, the dielectric constant of the dielectric film is required to be increased.

In this regard, Patent Documents 2 and 3 describe dielectric films in which dielectric particles having a high dielectric constant are dispersed in an elastomer. However, the dielectric particles have high crystallinity and are likely to agglomerate. For this reason, it is difficult to uniformly disperse the dielectric particles in the elastomer. When the dielectric particles agglomerate, agglomerated lumps serve as starting points to bring about dielectric breakdown. Patent Documents 2 and 3 describe using, as the dielectric particles, particles subjected to silane coupling treatment. The silane coupling treatment is performed for the purpose of improving the compatibility of the dielectric particles with the elastomer to integrate the dielectric particles with the elastomer. In other words, in the dielectric films described in Patent Documents 2 and 3, the particles originally having a high dielectric constant are blended, and the dielectric constant of the particles is not increased by the silane coupling treatment.

Patent Document 4 describes a dielectric film in which a polar compound such as diallyl dicarbonate is grafted to a polymer chain of an elastomer. Diallyl dicarbonate has ether bonds. Thus, diallyl dicarbonate may ionize through water entering the dielectric film to decrease the electric resistance of the dielectric film. Patent Document 5 describes polar groups such as a cyano group, which are directly introduced to side chains of a polymer so that the orientation of the dielectric film can be improved and the dielectric constant can be increased. However, it is difficult to directly introduce the polar groups to the polymer. When the content of the polar groups in the polymer is a certain content or more, crystallinity increases, and a glass transition temperature (Tg) increases. With this phenomenon, the dielectric constant of the dielectric film decreases, and flexibility degrades.

The present invention has been made in view of the above circumstances, and an object thereof is to provide a dielectric film that is flexible and is high in dielectric constant and dielectric breakdown strength. Another object thereof is to provide a method for manufacturing the dielectric film. Still another object thereof is to provide a transducer that is excellent in dielectric breakdown resistance and can output a large force.

(1) The dielectric film according to the present invention includes an elastomer and nanoparticles dispersed in the elastomer while chemically bound to the elastomer. The nanoparticles have cyano groups and are manufactured by a sol-gel process using an organometallic compound.

The nanoparticles are manufactured by a sol-gel process using an organometallic compound. In other words, the nanoparticles mainly include metallic oxide particles produced by hydrolysis and polycondensation of the organometallic compound. The nanoparticles have cyano groups (—CN). The cyano groups are arranged either on the surfaces of the metallic oxide particles or inside thereof or both on the surfaces of the metallic oxide particles and inside thereof. Since the nanoparticles have the cyano groups that are high in polarity, the dielectric constant of the nanoparticles is higher than the dielectric constant of metallic oxide particles manufactured by a simple sol-gel process. Containing the nanoparticles having a high dielectric constant increases the dielectric constant of the dielectric film according to the present invention.

The nanoparticles chemically bind to the elastomer. Therefore, the nanoparticles are less likely to agglomerate. The metallic oxide particles mainly included in the nanoparticles have insulting properties. Therefore, an insulating network formed by the elastomer and the nanoparticles interrupts the flow of electrons. Thus, the volume resistivity of the dielectric film according to the present invention increases.

In the present specification, the nanoparticles refer to particles the maximum length of which is 100 nm or less. The particle diameter of the nanoparticles can be measured by observing a section of the dielectric film with a transmission electron microscope (TEM), for example. Although a method for manufacturing the dielectric film will be described in detail later, it is estimated that the particle diameter of the particles (the metallic oxide particles having cyano groups) in a sol in a manufacturing process of the dielectric film and the particle diameter of the nanoparticles in the dielectric film are equal. Consequently, the particle diameter of the particles in the sol may be used as the particle diameter of the nanoparticles in the dielectric film. The particle diameter of the particles in the sol can be measured using a laser diffraction/scattering particle size/particle size distribution measuring apparatus, for example. Alternatively, the particle diameter of the particles in the sol can also be measured through observation using a scanning electron microscope (SEM) for a dried sol.

In the dielectric film according to the present invention, the cyano groups, which have polarity, are introduced to the elastomer indirectly via the metallic oxide particles having insulating properties. With this structure, the dielectric constant can be increased while maintaining the flexibility and dielectric breakdown strength of the dielectric film. The dielectric film according to the present invention has a high dielectric constant, and an electrostatic attraction with respect to an applied voltage increases. In addition, because of the high volume resistivity, many electric charges are accumulated near interfaces between the dielectric film and the electrodes. Consequently, a transducer including the dielectric film according to the present invention can gain a large force and displacement even when the applied voltage is small. The dielectric breakdown strength of the dielectric film according to the present invention is high. Thus, a higher voltage can be applied, and a larger force and displacement can be gained.

(2) A method for manufacturing the dielectric film according to the present invention includes: (a) producing a chelate compound of an organometallic compound by adding a chelating agent to the organometallic compound; (b) producing a sol of metallic oxide particles having cyano groups by adding a silane coupling agent having a cyano group, an organic solvent, and water to the chelate compound to hydrolyze the organometallic compound and react the organometallic compound with the silane coupling agent; (c) preparing a mixed solution by mixing the sol of the metallic oxide particles having cyano groups and a polymer solution containing a rubber polymer having a functional group capable of reacting with a hydroxy group; and (d) forming a dielectric film by applying the mixed solution to a substrate and by curing a coating film.

In the manufacturing method according to the present invention, the mixed solution in which the sol of the metallic oxide particles having cyano groups and the polymer solution containing the rubber polymer are mixed is formed into a film to manufacture the dielectric film according to the present invention. In the step (a), an organometallic compound as a raw material is chelated using a chelating agent. The organometallic compound is hydrolyzed by reaction with water. By chelating the organometallic compound in advance, a rapid reaction of the organometallic and water is suppressed in the next step, thereby allowing metallic oxide particles having a small particle diameter to be manufactured without being agglomerated.

Next, in the step (b), the organometallic compound is hydrolyzed to react the hydrolyzed organometallic compound with the silane coupling agent having a cyano group. In other words, a hydroxy group (—OH) of the hydrolyzed organometallic compound and a silanol group (Si—OH) obtained through hydrolysis of an alkoxy group of the silane coupling agent having a cyano group are reacted with each other to bind the silane coupling agent to the produced metallic oxide particles and introduce cyano groups. Thus, a sol of the metallic oxide particles having cyano groups is produced.

Next, in the step (c), the sol of the metallic oxide particles having cyano groups and the polymer solution containing a rubber polymer are mixed with each other to prepare a mixed solution. Hydroxy groups remain in the metallic oxide particles in the sol. The rubber polymer has the functional group capable of reacting with a hydroxy group. Therefore, in the following step (d), the coating film made from the mixed solution is cured and the hydroxy group and the functional group react with each other so that the metallic oxide particles having cyano groups and the rubber polymer chemically bind to each other. Thus, the metallic oxide particles having cyano groups (the nanoparticles) are uniformly dispersed in the cured rubber polymer (the elastomer). In the manufacturing method according to the present invention, it is possible to easily manufacture the dielectric film according to the present invention.

(3) A transducer according to the present invention includes the dielectric film according to the present invention and a plurality of electrodes arranged with the dielectric film interposed therebetween.

The transducer according to the present invention includes the dielectric film according to the present invention. As described above, the dielectric constant of the dielectric film according to the present invention is high. Therefore, an electrostatic attraction with respect to an applied voltage is large. In addition, the dielectric film according to the present invention is flexible. Therefore, the transducer according to the present invention can gain a large force and displacement even when the applied voltage is low. The dielectric film according to the present invention has high dielectric breakdown strength. Therefore, the transducer according to the present invention can gain a larger force and displacement by applying a higher voltage.

DESCRIPTION OF THE REFERENCE NUMERALS

Figure 1:
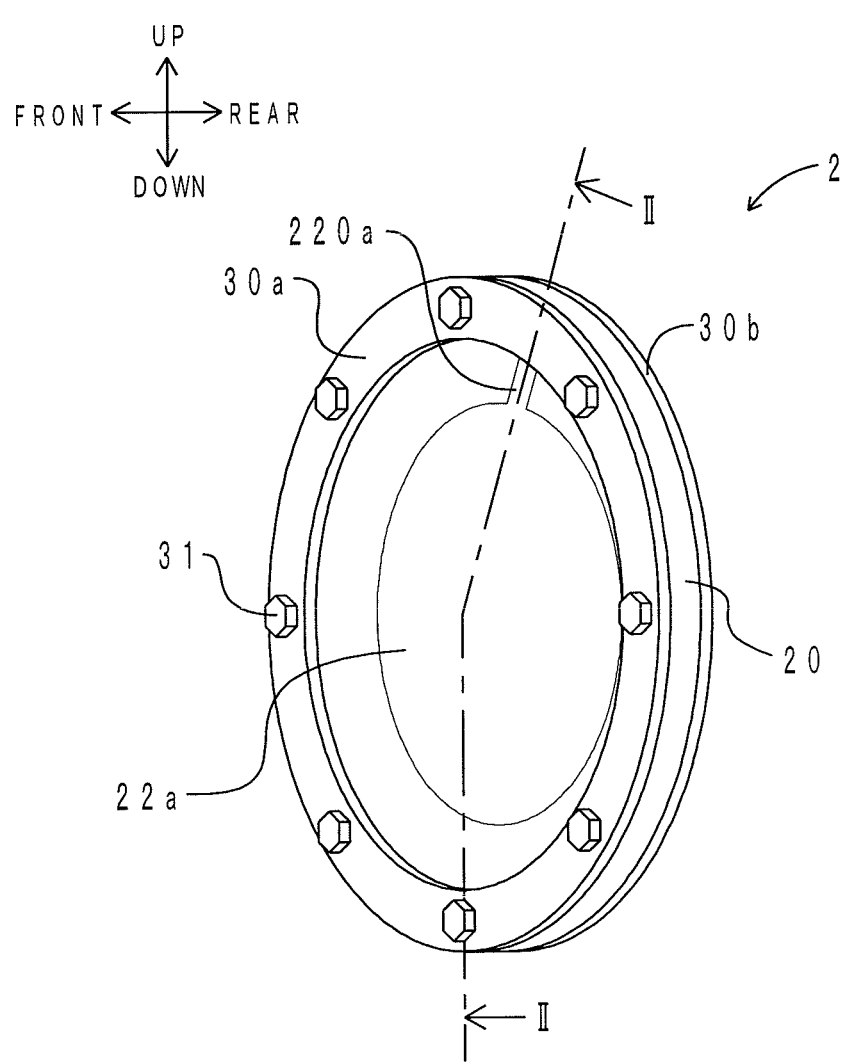
FIG. 1 a perspective view of a speaker as an embodiment of a transducer according to the present invention.

2: Speaker (Transducer), 20: Vibrating member, 21a to 21c: Dielectric film, 22a to 22d: Electrode, 23a, 23b: Insulating film, 220a to 220d: Terminal, 30a: Front frame, 30b: Rear frame, 31: Bolt, 32: Nut.

5: Actuator (Transducer), 50: Dielectric film, 51a, 51b: Electrode, 52: Upper chuck, 53: Lower chuck.

DETAILED DESCRIPTION OF THE EMBODIMENTS

Embodiments of a dielectric film, a method for manufacturing the same, and a transducer according to the present invention will be described. The dielectric film, the method for manufacturing the same, and the transducer according to the present invention are not limited to the embodiments below and may be embodied in various ways in which modifications, improvements, or the like that can be performed by those skilled in the art are performed without departing from the scope of the present invention.

<Dielectric Film>

The dielectric film according to the present invention includes an elastomer and nanoparticles.

[Elastomer]

The elastomer is not limited to a particular elastomer so long as it can chemically bind to the nanoparticles and can be dissolved in a polar solvent serving as a component of a sol solution in a manufacturing process of the dielectric film. In view of increasing an electrostatic attraction with respect to an applied voltage, an elastomer having high polarity, that is, a high dielectric constant is preferably employed. Specifically, an elastomer having a dielectric constant of 2.8 or more (at a measurement frequency of 100 Hz) is preferable. Examples of the elastomer having a high dielectric constant include nitrile rubber (NBR), hydrogenated nitrile rubber (H—NBR), acrylic rubber, ethylene-vinyl acetate copolymers, ethylene-vinyl acetate-acrylic acid ester copolymers, epichlorohydrin rubber, chloroprene rubber, chlorinated polyethylene, chlorosulfonated polyethylene, and urethane rubber. One of the elastomers can be used alone, or two or more of them can be mixed for use.

As will be described later in the manufacturing method, the dielectric film according to the present invention is manufactured using a rubber polymer having functional groups that can react with hydroxy groups of the nanoparticles. Examples of the functional groups that can react with hydroxy groups include a carboxy group (—COOH), an amino group (—NH), and an epoxy group. Therefore, any elastomer modified by, for example, introducing such functional groups into the elastomer may be used. Preferable examples include carboxy group-modified nitrile rubber (X—NBR) and carboxy group-modified hydrogenated nitrile rubber (XH—NBR). X—NBR and XH—NBR preferably have an acrylonitrile content (combined AN amount) of 33% by mass or more. The combined AN amount is the mass ratio of acrylonitrile with the entire rubber mass being 100% by mass.

[Nanoparticles]

The nanoparticles are manufactured by a sol-gel process using an organometallic compound and mainly include metallic oxide particles. In view of being high in insulating properties, the metallic oxide particles included in the nanoparticles preferably contain one or more elements selected from titanium, zirconium, and silicon. Examples thereof include oxide particles such as titanium dioxide ($TiO_2$), zirconium dioxide ($ZrO_2$), silica ($SiO_2$) and composite particles of these ($TiO_2/ZrO_2$, $TiO_2/SiO_2$, and the like). The nanoparticles have cyano groups. The cyano groups may be arranged either on the surfaces of the metallic oxide particles or inside thereof or both on the surfaces of the metallic oxide particles and inside thereof. A method for introducing the cyano groups to the metallic oxide particles will be described in the method for manufacturing the dielectric film described below.

The nanoparticles chemically bind to the elastomer through the reaction of their own hydroxy groups and the functional groups of the elastomer and are dispersed in the elastomer. The nanoparticles contained in the elastomer may be one kind or two or more of kinds of metallic oxides.

The content of the nanoparticles may appropriately be determined in accordance with the amount of the cyano groups that the nanoparticles have so that a desired dielectric constant and flexibility can be achieved in the dielectric film. The content of the nanoparticles may be 1 part by mass or more and 70 parts by mass or less with respect to 100 parts by mass of the elastomer, for example. If the content of the nanoparticles is less than 1 part by mass, the amount of the cyano groups to be introduced is small, and not only the effect of increasing the dielectric constant is small, but also the effect of increasing the volume resistivity is small. The content of the nanoparticles is preferably 10 parts by mass or more. In contrast, if the amount of the nanoparticles exceeds 70 parts by mass, the modulus of elasticity of the dielectric film increases, and flexibility is impaired.

In view of making the film quality of the dielectric film uniform and the like, the particle diameter of the nanoparticles is preferably smaller. The median diameter of the nanoparticles in the elastomer is preferably 10 nm or more and 50 nm or less, for example. The median diameter is more preferably 30 nm or less and further preferably 20 nm or less.

[Other Components]

The dielectric film according to the present invention may contain other components in addition to the elastomer and the nanoparticles. Examples of the other components include cross-linking agents, reinforcing agents, plasticizers, antioxidants, and colorants. When insulating inorganic particles or the like are blended as a reinforcing agent, for example, the mechanical strength and the dielectric breakdown strength of the dielectric film can further be increased.

[Properties of Dielectric Film]

The thickness of the dielectric film according to the present invention is not limited to a particular thickness. When the dielectric film is used for the transducer, the thickness of the dielectric film is preferably smaller in view of size reduction, driving at a low voltage, increasing displacement, and the like. In this case, also in consideration of dielectric breakdown resistance and the like, the thickness of the dielectric film is preferably 1 µm or more and 100 µm or less. The thickness of the dielectric film is more preferably 50 µm or less and further preferably 10 µm or less. In view of increasing the electrostatic attraction with respect to the applied voltage, the dielectric constant of the dielectric film according to the present invention is preferably 13 or more. In view of flexibility, the modulus of elasticity of the dielectric film according to the present invention is preferably 50 MPa or less. In the present specification, as the modulus of elasticity, a static shear modulus of elasticity calculated by measuring a tensile force with 25% of strain in a tensile test stipulated in JIS K 6254: 2010 is employed.

<Method for Manufacturing Dielectric Film>

The method for manufacturing a dielectric film according to the present invention includes (a) a chelating process, (b) a sol producing process, (c) a mixed solution preparing process, and (d) a film forming process. Hereinafter, each process will be described in order.

[Chelating Process]

In the present process, the chelating agent is added to the organometallic compound to produce the chelate compound of the organometallic compound. When producing a sol of complex particles such as $TiO_2/ZrO_2$ and $TiO_2/SiO_2$, an organometallic compound serving as the raw material of one metallic oxide compound constituting the complex particles is chelated in the present process, and in the following sol producing process, an organometallic compound serving as the raw material of the other metallic oxide compound may be added to the chelate compound.

The organometallic compound may be appropriately selected from metal alkoxide compounds and metal acylate compounds depending on the type of desired metallic oxide particles. Examples of the metal alkoxide compound include tetra-n-butoxy titanium, tetra-n-butoxy zirconium, tetra-n-butoxy silane, tetraisopropoxy titanium, tetraethoxysilane, tetrakis(2-ethyihexyloxy) titanium, and titanium butoxide dimer. Examples of the metal acylate compound include polyhydroxy titanium stearate and zirconium tributoxy monostearate.

Examples of a chelating agent include β-diketone such as acetylacetone, benzoyl acetone, and dibenzoylmethane, β-keto acid ester such as ethyl acetoacetate and ethyl benzoylacetate, triethanolamine, lactic acid, 2-ethylhexane-1,3-diol, and 1,3-hexanediol. The chelating agent is preferably the same as a solvent for dissolving a rubber polymer in the mixed solution preparing process.

[Sol Producing Process]

In the present process, the silane coupling agent having a cyano group, the organic solvent, and water are added to the produced chelate compound to hydrolyze the organometallic compound and react the organometallic compound with the silane coupling agent, so that the sol of the metallic oxide particles having cyano groups is obtained. In the present process, a hydroxy group (—OH) of the hydrolyzed organometallic compound and a silanol group (Si—OH) obtained through the hydrolysis of an alkoxy group of the silane coupling agent having a cyano group react with each other to bind the silane coupling agent having a cyano group to the produced metallic oxide particles. With this reaction, the sol of the metallic oxide particles having cyano groups is produced.

The silane coupling agent having a cyano group may appropriately be selected from compounds each having a functional group of a cyano group at its end in consideration of reactivity with the organometallic compound and the like. Compounds of Formulae (1) to (6) below are preferable, for example. Among them, trimethoxysilanes with a short alkoxy group such as the compounds of Formulae (1), (4), and (6) are favorable in the reactivity with the organometallic compound and are more preferable. One of the silane coupling agents having a cyano group may be used alone, or two or more of them may be mixed for use.

(Formulae 1 to 6)

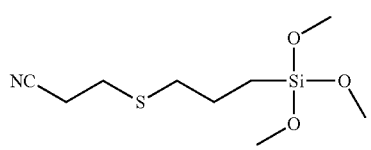

(1)

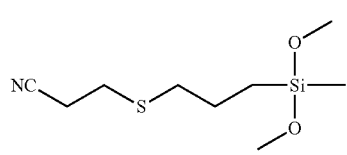

(2)

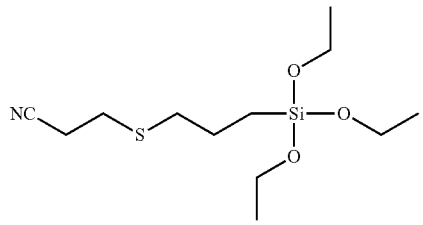

(3)

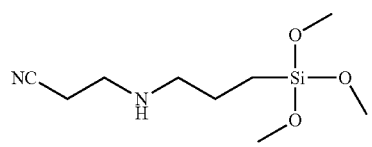

(4)

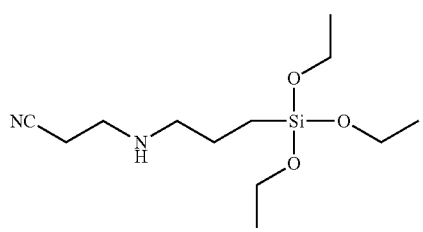

(5)

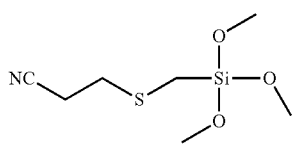

(6)

In the present process, the silane coupling agent having a cyano group is preferably added prior to the water. If the silane coupling agent having a cyano group is added after the water is added, the silane coupling agent that does not react with the organometallic compound is more likely to remain. An unreacted silane coupling agent reacts by itself to produce particulate agglomerates. When the agglomerates are present in the dielectric film, they serve as starting points, which are likely to bring about dielectric breakdown.

For the organic solvent, alcohols such as methanol, ethanol, and isopropyl alcohol (IPA), ketones such as methyl ethyl ketone (MEK) and methyl isobutyl ketone (MIBK), and ethers such as tetrahydrofuran (THF) may be used. For example, addition of IPA improves the affinity between the chelate compound and water, thereby making nuclei of metallic oxide particles likely to be produced. Addition of MEK can improve the compatibility between the sol containing metallic oxide particles having cyano groups and a polymer solution in the mixed solution preparing process.

In addition to the organic solvent, acetic acid, formic acid, or the like is preferably added for the purpose of promoting the hydrolysis reaction of the silane coupling agent having a cyano group and achieving a pH range in which the silanol group is stabilized.

The addition of the silane coupling agent having a cyano group, the organic solvent, and the water to the chelate compound may be performed with stirring. Also after the addition, the stirring may be continued at a temperature of 40° C. or more and 80° C. or less. By doing so, the production reaction of the metallic oxide particles and the reaction of the metallic oxide particles and the silane coupling agent having a cyano group can be promoted while leaving the hydroxy groups of the metallic oxide particles. The stirring is sufficient to be performed for about one to a few hours. The obtained sol may be provided for the mixed solution preparing process as it is. Alternatively, the obtained sol may be provided for the mixed solution preparing process after being left at rest for a while at room temperature. By subjecting the sol to heat treatment at high temperature, for example, the crystallinity of the metallic oxide particles is increased, whereby the dielectric constant can be increased. However, when the sol is subjected to high temperature, the number of the hydroxy groups of the metallic oxide particles decreases. Thus, the metallic oxide particles become less likely to chemically bind to the rubber polymer at the following process.

[Mixed Solution Preparing Process]

In the present process, the produced sol of the metallic oxide particles having cyano groups and a polymer solution containing a rubber polymer having functional groups that can react with hydroxy groups are mixed to prepare a mixed solution.

The polymer solution is prepared by dissolving a predetermined rubber polymer in a solvent. As described above, the solvent used is preferably the same as the chelating agent chelating the organometallic compound. The amount of the sol to be blended may be appropriately determined in accordance with the amount of the nanoparticles to be contained in the elastomer. The mixed solution may be blended with other components such as a cross-linking agent and insulating inorganic particles as needed. In this case, the other components may be blended into the polymer solution in advance. The cross-linking agent is preferably an organometallic compound. Reactive residues of the cross-linking agent can be one of causes decreasing the dielectric breakdown strength of the dielectric film. Use of an organometallic compound makes reactive residues less likely to remain, thereby suppressing degradation in the dielectric breakdown strength of the dielectric film.

[Film Forming Process]

In the present process, the prepared mixed solution is applied to a substrate, and the resultant coating film is cured to obtain a dielectric film. A method for applying the mixed solution is not particularly limited. Examples of the method include printing methods such as inkjet printing, flexographic printing, gravure printing, screen printing, pad printing, and lithography, the dip method, the spray method, and the bar-coating method. The curing temperature of the coating film may be appropriately determined by taking into account the type of the solvent used and a reaction rate. The curing temperature is preferably set at the boiling point of the solvent or above, for example.

Hydroxy groups remain in the metallic oxide particles in the sol. The rubber polymer has the functional group capable of reacting with a hydroxy group. Therefore, in the present process, the coating film made from the mixed solution is cured and the hydroxy group and the functional group react with each other so that the metallic oxide particles having cyano groups and the rubber polymer chemically bind to each other. Thus, the dielectric film according to the present invention is manufactured in which the metallic oxide particles having cyano groups (the nanoparticles) are uniformly dispersed in the cured rubber polymer (the elastomer).

<Transducer>

The transducer according to the present invention includes the dielectric film according to the present invention and a plurality of electrodes arranged with the dielectric film interposed therebetween. The transducer according to the present invention may be formed by alternately stacking a plurality of dielectric films and a plurality of electrodes with each other. By employing a stacked structure, a larger force can be generated. The configuration of and a method for manufacturing the dielectric film according to the present invention are as described above, and the description thereof will be omitted in this section. Also in the transducer according to the present invention, a preferable embodiment of the dielectric film according to the present invention is preferably employed.

In the transducer according to the present invention, the material of the electrodes is not particularly limited. The electrodes are preferably expandable and contractible in accordance with the deformation of the dielectric film. In this case, because the deformation of the dielectric film is less likely to be restricted by the electrodes, desired output is likely to be gained in the transducer according to the present invention. For example, the electrodes can be made from a conductive paste or a conductive coating in which a conductive material is mixed into a binder such as oil and an elastomer. Examples of the conductive material include carbon material such as carbon black, ketjen black, a carbon nanotube, and graphene, and metallic powder of silver or the like. The electrodes may also be provided by knitting carbon fibers or metallic fibers in mesh.

Figure 2:
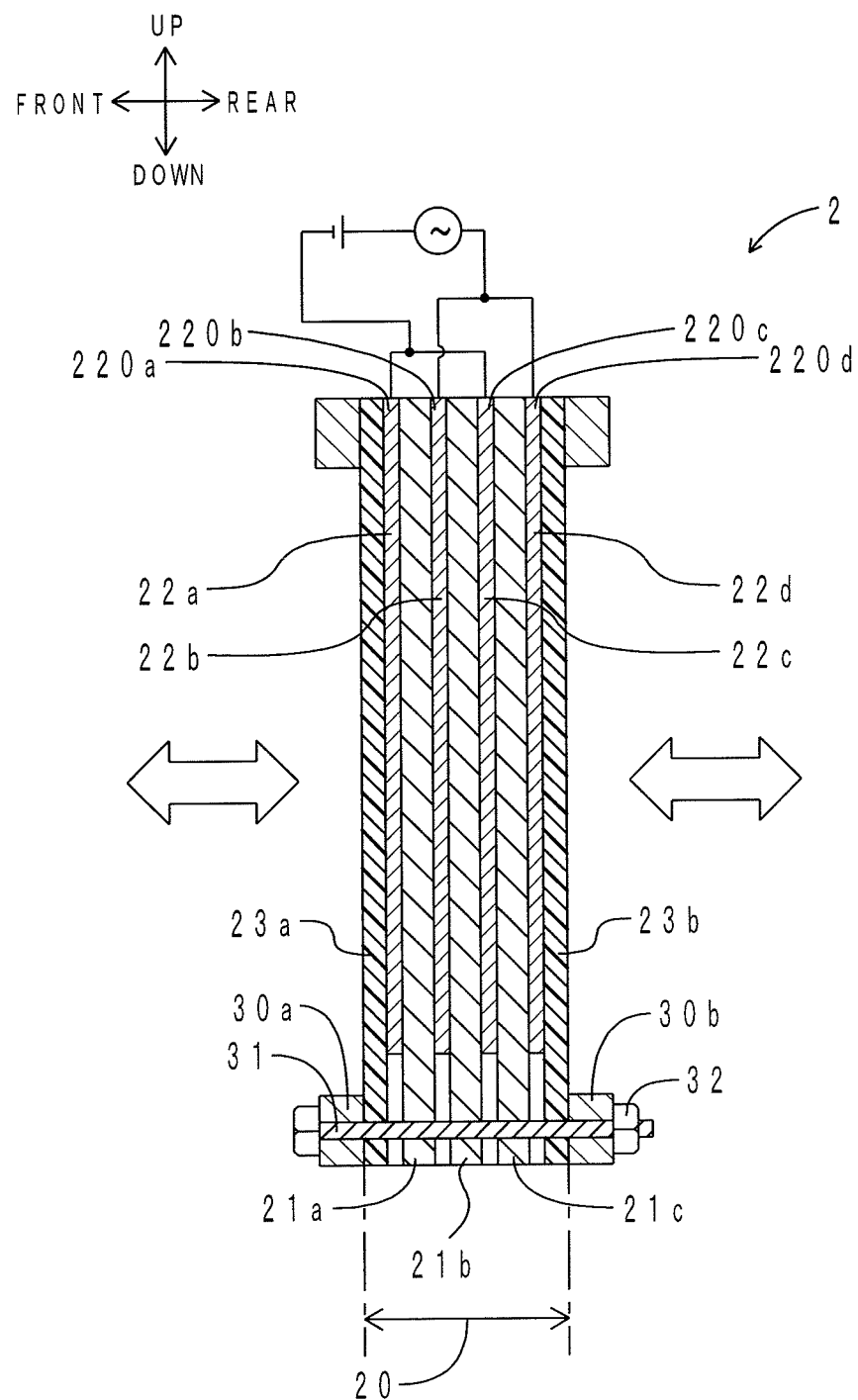
FIG. 2 is a II-II sectional view of FIG. 1.

The following describes an embodiment in which the transducer according to the present invention is embodied as a speaker. FIG. 1 illustrates a perspective view of the speaker of the present embodiment. FIG. 2 illustrates a II-II sectional view of FIG. 1. FIG. 1 illustrates a front insulating film in a perspective manner. First, a configuration of the speaker of the present embodiment will be described. As illustrated in FIG. 1 and FIG. 2, this speaker 2 includes a vibrating member 20, a front frame 30a, and a rear frame 30b.

The front frame 30a and the rear frame 30b are formed of resin and have a ring shape. The front frame 30a and the rear frame 30b are arranged facing each other with a peripheral part of the vibrating member 20 interposed therebetween. The front frame 30a and the rear frame 30b are fixed to each other with eight bolts 31 and eight nuts 32. Sets of "the bolt 31 and the nut 32" are arranged spaced apart from each other by a certain gap in the circumferential direction of the speaker 2. The bolt 31 passes through from a front face of the front frame 30a to a rear face of the rear frame 30b. The nut 32 is screwed on a distal end of the bolt 31.

The vibrating member 20 is interposed between the front frame 30a and the rear frame 30b. The vibrating member 20 includes three dielectric films 21a to 21c, four electrodes 22a to 22d, and two insulating films 23a and 23b. In the vibrating member 20, the dielectric films 21a to 21c and the electrodes 22a to 22d are alternately stacked with each other.

The dielectric films 21a to 21c all contain carboxy group-modified hydrogenated nitrile rubber and nanoparticles and are shaped like a circular thin film. The nanoparticles include $TiO_2$ particles having cyano groups. The nanoparticles are manufactured by a sol-gel process using a titanium alkoxide and the silane coupling agent having a cyano group of Formula (1) above. The thickness of the dielectric films 21a to 21c is 20 µm. The dielectric films 21a to 21c are included in the dielectric film according to the present invention. The electrodes 22a to 22d all contain silicone rubber and silver particles. The electrodes 22a to 22d are each shaped like a circular thin film that is smaller in diameter than the dielectric films 21a to 21c. The electrodes 22a to 22d are arranged substantially concentrically with the dielectric films 21a to 21c. The electrodes 22a to 22d include terminals 220a to 220d, respectively. The terminals 220a to 220d protrude in the radial direction from upper peripheral edges of the electrodes 22a to 22d, respectively. The terminals 220a to 220d are all shaped like a strip. To the terminals 220a to 220d, voltage is applied externally via wiring (not illustrated). The insulating films 23a and 23b are both formed of acrylic rubber and are shaped like a circular thin film of the same size as the dielectric films 21a to 21c.

The following describes a method for manufacturing the speaker 2 of the present embodiment. First, the dielectric films 21a to 21c are prepared. Next, conductive paint in which silver powder is mixed with silicone rubber is printed on both the front and rear faces of the dielectric film 21a to form the electrodes 22a and 22b. Insulating paint containing acrylic rubber is then printed on the front face of the formed electrode 22a and the entire front face of the dielectric film 21a except a portion on which the electrode 22a is formed to form the insulating film 23a. Similarly, the conductive paint is printed on both the front and rear faces of the dielectric film 21c to form the electrodes 22c and 22d. The insulating paint is then printed on the rear face of the formed electrode 22d and the entire rear face of the dielectric film 21c except a portion on which the electrode 22d is formed to form the insulting film 23b. The dielectric film 21a having the electrodes 22a and 22b and the insulating film 23a, the dielectric film 21b, and the dielectric film 21c having the electrodes 22c and 22d and the insulting film 23b are then stacked with each other to manufacture the vibrating member 20. Subsequently, the peripheral part of the manufactured stacked body is clamped by the front frame 30a and the rear frame 30b. In this state, the front frame 30a and the rear frame 30b are fixed with the eight bolts 31 and the eight nuts 32. The speaker 2 is thus manufactured.

The following describes the motion of the speaker 2 of the present embodiment. In an initial state, a certain bias voltage is applied to the electrodes 22a to 22d via wiring (not illustrated). In this state, an AC voltage serving as a sound electric signal is applied to the electrodes 22a to 22d. The vibrating member 20 then vibrates in the front-rear direction as illustrated by the white arrows in FIG. 2 caused by changes in the film thickness of the dielectric films 21a to 21c. Thus, air vibrates to generate sounds.

The following describes an effect of the speaker 2 of the present embodiment. In the speaker 2 of the present embodiment, the dielectric films 21a to 21c are flexible and are excellent in stretchability. In addition, the dielectric films 21a to 21c are high in dielectric constant. The electrodes 22a to 22d are also flexible and can expand and contract integrally with the dielectric films 21a to 21c. Consequently, in the speaker 2, a deformation amount of the vibrating member 20 with respect the applied voltage is large, and output sound pressure is high. The dielectric films 21a to 21c are high in dielectric breakdown strength. Consequently, the speaker 2 is excellent in durability.

The vibrating member 20 includes the three dielectric films 21a to 21c stacked with each other through the electrodes 22a to 22d. Thus, the deformation amount of the vibrating member 20 with respect to the applied voltage is large and the output sound pressure is high, compared to the case where electrodes are arranged on both sides of one dielectric film. The speaker 2 is lightweight, small-sized, and relatively inexpensive.

EXAMPLES

The present invention will be more specifically described with reference to examples.

<Manufacture of Silane Coupling Agent Having Cyano Group>

First, 5.3 g (0.10 mol) of acrylonitrile and 21.57 g (0.11 mol) of (3-mercaptopropyl)trimethoxysilane were dissolved in 70 mL of methanol (super dehydrated). Next, diisopropyl amine serving as an amine catalyst was added to this methanol solution and was stirred at room temperature overnight. The addition amount of diisopropyl amine was 5 mol % with respect to (3-mercaptopropyl)trimethoxysilane. After distilling off the solvent under reduced pressure, methanol was added thereto to prepare a methanol solution containing the silane coupling agent, of 20 wt/vol %, having a cyano group of Formula (1) (hereinafter, referred to as a "CN-containing coupling agent").

<Manufacture of Dielectric Film>

Example 1

First, 0.02 mol of acetylacetone was added to 0.01 mol of tetraisopropoxy titanium as an organometallic compound to chelate it. Next, 0.083 mol of isopropyl alcohol (IPA) and 32 g of the methanol solution containing the CN-containing coupling agent of 20 wt/vol % were added to the obtained chelate compound. Subsequently, 0.139 mol of methyl ethyl ketone (MEK), 0.03 mol of acetic acid, and 0.08 mol of water were added thereto with stirring, and after the end of the addition, the temperature of the mixture was increased up to 40° C. and the mixture was stirred for further 2 hours to obtain a sol of $TiO_2$ particles coupled with the CN-containing coupling agent. The obtained sol was left at rest at room temperature overnight and was then condensed by an evaporator so that its mass was decreased by half. The condensed sol was left at rest at room temperature overnight. The thus produced sol will be referred to as a "condensed sol" below. The particle diameter of the particles contained in the condensed sol was measured using a laser diffraction/scattering particle size/particle size distribution measuring apparatus manufactured by Nikkiso Co., Ltd., and the median diameter was 8 nm.

Next, carboxy group-modified hydrogenated nitrile rubber ("Therban (trademark) XT8889" manufactured by LANXESS) was dissolved in acetylacetone to prepare a polymer solution with a polymer concentration of 12% by mass. Subsequently, the condensed sol and an acetylacetone solution containing as an organometallic compound tetrakis (2-ethylhexyloxy) titanium of 20% by mass, which serves as a cross-linking agent, were mixed with the prepared polymer solution to prepare a mixed solution. The condensed sol was blended so that the amount of $TiO_2$ was 6.6 parts by mass and the amount of CN-containing coupling agent was 52 parts by mass with respect to 100 parts by mass of the polymer content. The cross-linking agent was blended so that the amount of tetrakis(2-ethylhexyloxy) titanium was 5 parts by mass with respect to 100 parts by mass of the polymer content.

The prepared mixed solution was applied to a substrate, dried, and then heated at 150° C. for 1 hour to manufacture a dielectric film with a thickness of 20 μm.

Example 2

A dielectric film was manufactured in the same manner as in Example 1 except that the addition amount of the methanol solution containing the CN-containing coupling agent of 20 wt/vol % was changed to 16 g in the production of the sol. In this case, the condensed sol was blended to the polymer solution so that the amount of $TiO_2$ was 6.6 parts by mass and the amount of CN-containing coupling agent was 26 parts by mass with respect to 100 parts by mass of the polymer content.

Example 3

A dielectric film was manufactured in the same manner as in Example 1 except that the addition amount of the methanol solution containing the CN-containing coupling agent of 20 wt/vol % was changed to 8 g in the production of the sol.

In this case, the condensed sol was blended to the polymer solution so that the amount of $TiO_2$ was 6.6 parts by mass and the amount of CN-containing coupling agent was 13 parts by mass with respect to 100 parts by mass of the polymer content.

Comparative Example 1

A dielectric film was manufactured by blending the CN-containing coupling agent alone directly to the polymer solution. First, a methanol solution containing the CN-containing coupling agent of 20 wt/vol % and an acetylacetone solution containing tetrakis(2-ethylhexyloxy) titanium of 20% by mass, which serves as a cross-linking agent, were mixed with the same polymer solution of carboxy group-modified hydrogenated nitrile rubber as that used in Example 1 to prepare a mixed solution. The methanol solution containing the CN-containing coupling agent of 20 wt/vol % was blended so that the amount of CN-containing coupling agent was 52 parts by mass with respect to 100 parts by mass of the polymer content. The cross-linking agent was blended so that the amount of tetrakis(2-ethylhexyloxy) titanium was 5 parts by mass with respect to 100 parts by mass of the polymer content. Subsequently, the prepared mixed solution was applied to a substrate, dried, and then heated at 150° C. for 1 hour to manufacture a dielectric film with a thickness of 20

Comparative Example 2

The sol of $TiO_2$ particles was produced without using the CN-containing coupling agent, and a dielectric film was produced using the sol. First, 0.02 mol of acetylacetone was added to 0.01 mol of tetraisopropoxy titanium as an organometallic compound to chelate it. Next, 0.083 mol of IPA, 0.139 mol of MEK, and 0.08 mol of water were added to the obtained chelate compound with stirring, and after the end of the addition, the temperature of the mixture was increased to 40° C. and the mixture was stirred for further 2 hours to obtain a sol of $TiO_2$ particles. The obtained sol was left at rest at room temperature overnight. The thus produced sol of $TiO_2$ particles was added to and mixed with the same polymer solution of carboxy group-modified hydrogenated nitrile rubber as that used in Example 1, and furthermore, an acetylacetone solution containing tetrakis(2-ethylhexyloxy) titanium of 20% by mass, which serves as a cross-linking agent, was added thereto and mixed therewith to prepare a mixed solution. The sol of $TiO_2$ particles was blended so that the amount of $TiO_2$ was 6.6 parts by mass with respect to 100 parts by mass of the polymer content. The cross-linking agent was blended so that the amount of tetrakis(2-ethylhexyloxy) titanium amount was 5 parts by mass with respect to 100 parts by mass of the polymer content.

Table 1 below collectively shows the types and blended amounts of the raw materials used for the manufacture of the dielectric films of Examples and Comparative Examples.

<Evaluation of Dielectric Film>

The manufactured dielectric films were evaluated based on the following items. Table 1 below collectively shows the evaluation results of the dielectric films.

[Volume Resistivity]

The volume resistivity of each of the dielectric films was measured in conformity with the parallel terminal electrode system stipulated in JIS K6271: 2008. The measurement was performed with a DC voltage of 100V applied.

<Modulus of Elasticity>

The static shear modulus of elasticity of each of the dielectric films was calculated by measuring a tensile force with 25% of strain in a tensile test stipulated in JIS K 6254: 2010.

[Dielectric Constant]

The dielectric constant of each of the dielectric films was measured using a dielectric constant measuring interface (Type 1296 manufactured by the same) and a frequency response analyzer (Type 1255B manufactured by the same) in combination, with the dielectric film set in a sample holder (Type 12962A manufactured by Solartron).

<Evaluation of Actuator Characteristics>

Using the manufactured dielectric films, actuators as a form of the transducer were manufactured, and actuator characteristics were evaluated. First, carbon black was mixed with and dispersed in an acrylic rubber polymer solution to prepare conductive paint. The conductive paint was then screen-printed on both faces of the manufactured dielectric films in the thickness direction to form electrodes. The actuators including the dielectric films of Examples are included in the transducer according to the present invention.

<Evaluation of Actuators>

Figure 3:
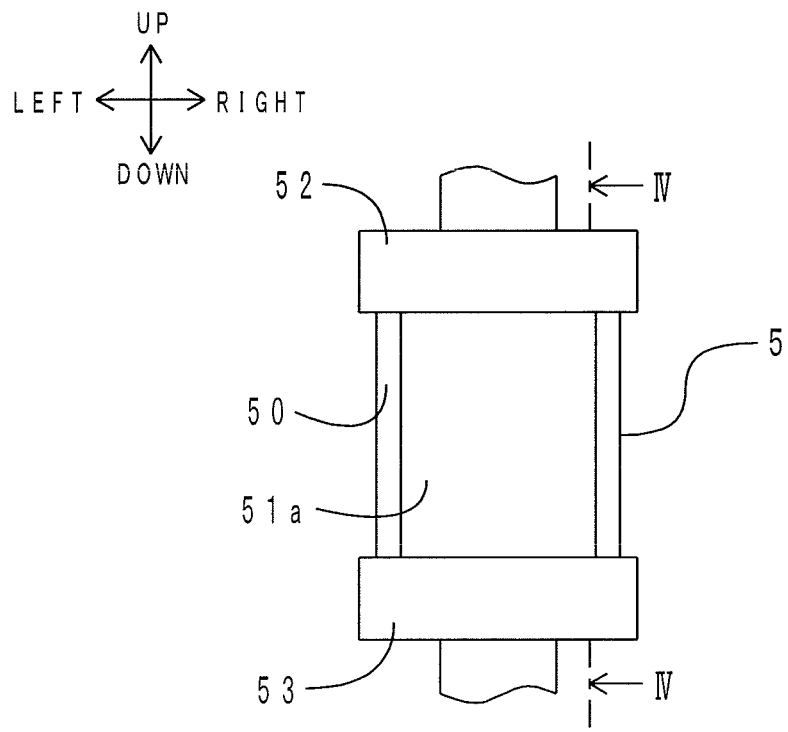
FIG. 3 is a front-side elevation view of an actuator mounted on a measuring apparatus.
Figure 4:
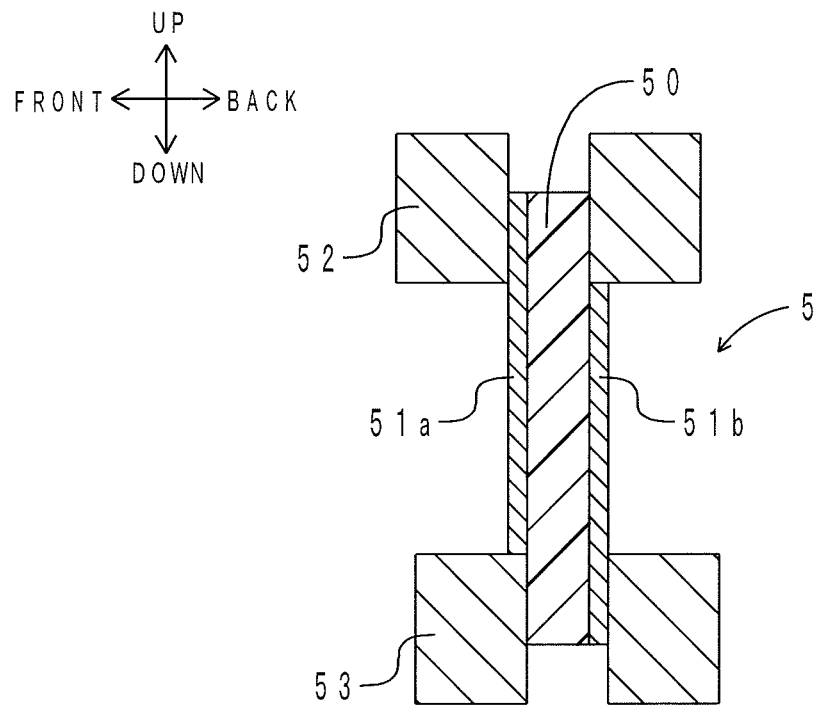
FIG. 4 is a IV-IV sectional view of FIG. 3.

The generated stress of each of the manufactured actuators was measured. A measuring apparatus and a measuring method will be described. FIG. 3 illustrates a front-side elevation view of an actuator mounted on the measuring apparatus. FIG. 4 illustrates a Iv-Iv sectional view of FIG. 3.

As illustrated in FIG. 3 and FIG. 4, the upper end of an actuator 5 is held by an upper chuck 52 of the measuring apparatus. The lower end of the actuator 5 is held by a lower chuck 53. The actuator 5 is set between the upper chuck 52 and the lower chuck 53 while extended in advance in the up-down direction (with an elongation ratio of 25%). A load cell (not illustrated) is arranged above the upper chuck 52.

The actuator 5 includes a dielectric film 50 and a pair of electrodes 51a, 51b. The dielectric film 50 is a rectangular thin film of 50 mm long, 25 mm wide, and 20 μm thick in a natural state. The electrodes 51a, 51b are arranged so as to face each other in the front and back direction with the dielectric film 50 interposed therebetween. Each of the electrodes 51a, 51b has the shape of a rectangular thin film of 40 mm long, 25 mm wide, and 10 μm thick in a natural state. The electrodes 51a, 51b are arranged so as to be offset from each other by 10 mm in the up-down direction. In other words, the electrodes 51a, 51b overlap, with the dielectric film 50 interposed therebetween, within a range of 30 mm long and 25 mm wide. An electric wire (not shown) is connected to the lower end of the electrode 51a. Similarly, an electric wire (not shown) is connected to the upper end of the electrode 51b. The electrodes 51a, 51b are connected to a power source (not shown) through the respective electric wires.

When a voltage is applied between the electrodes 51a and 51b, an electrostatic attraction occurs between the electrodes 51a and 51b to compress the dielectric film 50. The dielectric film 50 thereby decreases in thickness and extends in an extension direction (the up-down direction). The extension of the dielectric film 50 decreases an extension force in the up-down direction. The extension force decreased through the voltage application was measured using a load cell and was determined to be a generated stress. The measurement of the generated stress was performed with the applied voltage increased stepwise until the dielectric film 50 was broken.

Figure 5:
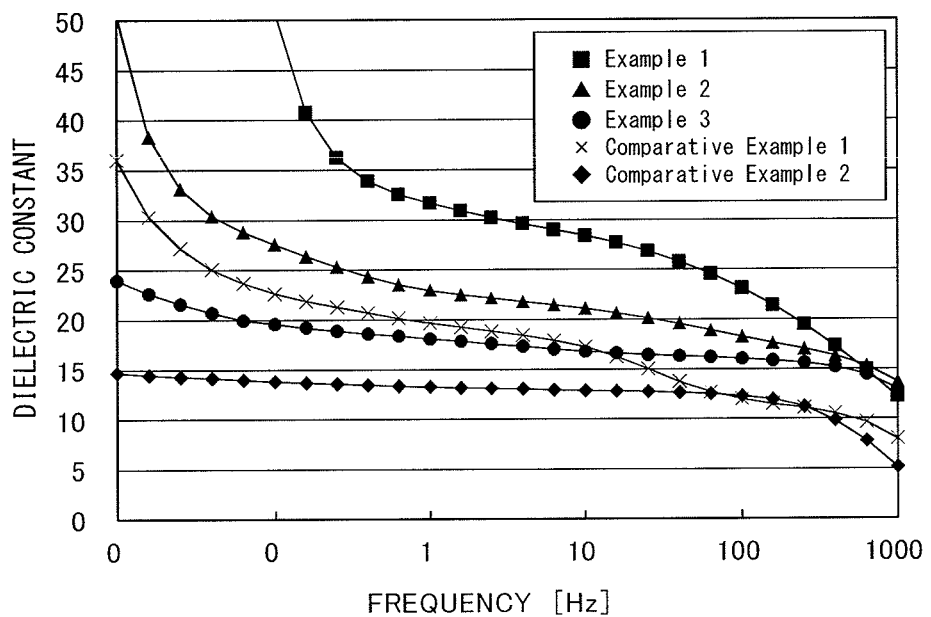
FIG. 5 is a graph illustrating measurement results of dielectric constants of dielectric films.
Figure 6:
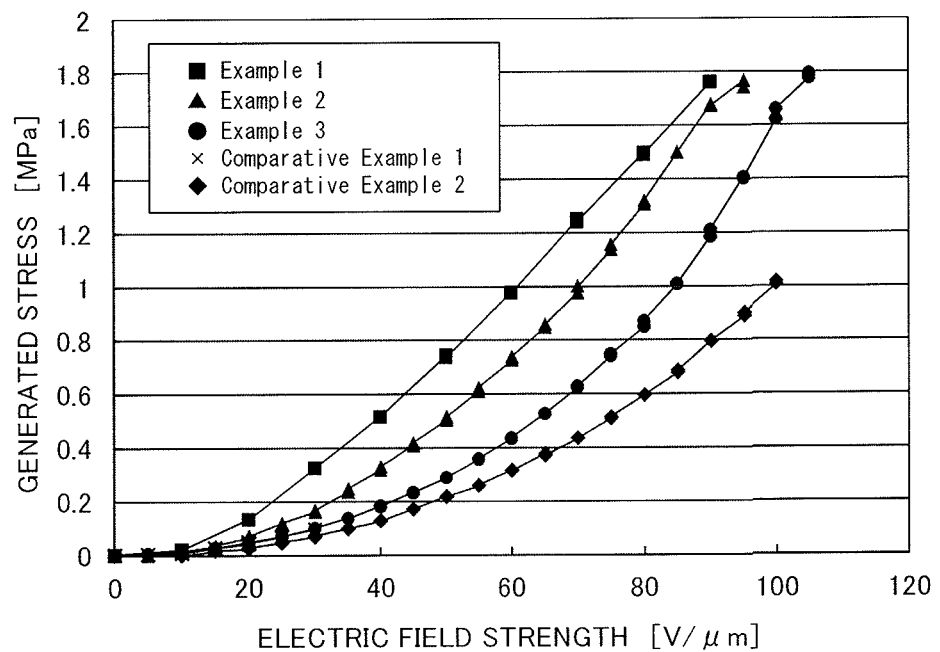
FIG. 6 is a graph illustrating measurement results of generated stresses of actuators.

Table 1 collectively shows the types and blended amounts of the raw materials used for the manufacture of the dielectric films and the evaluation results of the dielectric films and the actuator characteristics. FIG. 5 illustrates measurement results of the dielectric constants of the dielectric films. FIG. 6 illustrates measurement results of the generated stresses of the actuators.

TABLE 1

| Raw materials [parts by mass] | | Example 1 | Example 2 | Example 3 | Comparative Example 1 | Comparative Example 2 |
|---|---|---|---|---|---|---|
| Rubber polymer | XH-NBR | 100 | 100 | 100 | 100 | 100 |
| Cross-linking agent | Tetrakis(2-ethylhexyloxy)titanium | 5 | 5 | 5 | 5 | 5 |
| Nanoparticles | TiO$_2$ particles coupled with CN-containing coupling agent*[1] | 58.6 (52) | 32.6 (26) | 19.6 (13) | — | — |
| | CN-containing coupling agent | — | — | — | 52 | — |
| | TiO$_2$ particles | — | — | — | — | 6.6 |
| Evaluation | Volume resistivity [Ω · cm] | $4.5 \times 10^{11}$ | $7.8 \times 10^{11}$ | $2.0 \times 10^{12}$ | $5.4 \times 10^{11}$ | $3.6 \times 10^{12}$ |
| | Modulus of elasticity [MPa] | 12.3 | 8.5 | 8.1 | 4.3 | 9.0 |
| | Dielectric constant (at frequency of 100 Hz) | 22 | 16 | 15 | 12 | 12 |

*[1]Values in parentheses are amounts of CN-containing coupling agent.

As shown in Table 1 and illustrated in FIG. 5, the dielectric films of Examples 1 to 3 that contain the TiO$_2$ particles (the nanoparticles having cyano groups) manufactured by coupling the CN-containing coupling agent gave higher dielectric constants than the dielectric film of Comparative Example 2 containing the conventional TiO$_2$ particles. A larger amount of the coupled CN-containing coupling agent, that is, a higher cyano group content in the dielectric film gave a higher dielectric constant. For the dielectric film of Comparative Example 1, almost no increase in dielectric constant was observed in a practical frequency of around 50 to 100 Hz, though the dielectric film contained the CN-containing coupling agent.

As illustrated in FIG. 6, high voltages were able to be applied to the actuators including the dielectric films of Examples 1 to 3. The generated stress with respect to electric field strength increased in proportion to the magnitude of the dielectric constant of the dielectric films. In contrast, the actuator including the dielectric film of Comparative Example 1 underwent dielectric breakdown at an electric field strength of 30 V/μm. This phenomenon is attributed to the fact that the agglomerates produced through the reaction of the CN-containing coupling agent by itself serve as starting points of dielectric breakdown.

The transducer including the dielectric film according to the present invention can be widely used for actuators, sensors, and the like that perform conversion between mechanical energy and electric energy and speakers, microphones, noise cancellers, and the like that perform conversion between acoustic energy and electric energy.

What is claimed is:

1. A method for manufacturing the dielectric film, the method comprising:

(a) producing a chelate compound of an organometallic compound by adding a chelating agent to the organometallic compound;

(b) producing a sol of metallic oxide particles having cyano groups by adding a silane coupling agent having a cyano group, an organic solvent, and water to the chelate compound to hydrolyze the organometallic compound and react the organometallic compound with the silane coupling agent;

(c) preparing a mixed solution by mixing the sol of the metallic oxide particles having cyano groups and a polymer solution containing a rubber polymer having a functional group capable of reacting with a hydroxy group; and (d) forming a dielectric film by applying the mixed solution to a substrate and by curing a coating film, wherein the silane coupling agent having a cyano group is a compound of Formula (1) below:

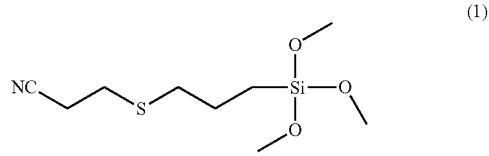

(1)

2. The method for manufacturing the dielectric film according to claim 1, wherein in the step (b), the silane coupling agent having a cyano group is added prior to the water.

* * * * *